(12) United States Patent
Chen et al.

(10) Patent No.: US 6,527,577 B1
(45) Date of Patent: Mar. 4, 2003

(54) CPU SOCKET HAVING SEPARATE RETENTION MEMBER

(75) Inventors: Sen-Jone Chen, Tu-Chen (TW); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/013,380

(22) Filed: Dec. 7, 2001

(51) Int. Cl.[7] ................................................. H01R 4/50
(52) U.S. Cl. ........................................ 439/342; 439/259
(58) Field of Search ................................ 439/342, 259, 439/261–265, 267, 268

(56) References Cited

U.S. PATENT DOCUMENTS 5,057,031 A * 10/1991 Sinclair ...................... 439/261
5,722,848 A * 3/1998 Lai et al. .................... 439/342
6,287,137 B1 * 9/2001 Noda et al. ................. 439/342
6,296,506 B1 * 10/2001 Mizumura et al. .......... 439/342

* cited by examiner

Primary Examiner—Hien Vu
(74) Attorney, Agent, or Firm—Wei Te Chung

(57) ABSTRACT

A CPU socket comprises a base (10) defining a plurality of passageways (111) therethrough and a pair of recesses (123) in a bottom surface thereof, a plurality of contacts (50) received in the corresponding passageways, a cover (20) defining a plurality of holes (211) in alignment with the passageways of the base and a pair of slits (223) in an upper surface thereof corresponding to the pair of recesses of the base, and a pair of retention member (40) each having a securing portion (41) retained in the cover and an elastic engaging portion (43) received in the recess of the base. When the cover moves between an open position where the pins of the CPU are disconnected from the conductive contacts of the base and a closed position where the pins of the CPU are connected with the conductive contacts of the base, the elastic engaging portion moves in the recess of the base while preventing the cover form separating the base.

6 Claims, 6 Drawing Sheets

CPU SOCKET HAVING SEPARATE RETENTION MEMBER

BACKGROUND OF THE INVENTION

1. Field of the Invention

The present invention generally relates to a Central Processing unit (CPU) socket, and particularly to a CPU socket having a separate retention member.

2. Description of Related Art

U.S. Pat. No. 5,722,848 discloses a conventional CPU socket for connecting a CPU to a Printed Circuit Board (PCB). Referring to FIGS. 6 and 7, a the CPU socket comprises a base 6 securely mounted on a PCB (not shown) and a cover 7 movably mounted on the base 6. A plurality of contacts 61 is received in corresponding holes 62 defined through the base 6. A lever 8 drives the cover 7 to move between an open position where pins of the CPU (not shown) is disconnected from the contacts 61 and a closed position where the pins of the CPU is connected with the contacts 61. The base 6 defines a pair of L-shaped recesses 63 at a rear wall thereof. The cover 7 includes a pair of L-shaped retention latches 71 integrally extending downwards from a rear wall thereof corresponding to the recesses 63. Each retention latch 71 includes a vertical aligning section 711 and a horizontal hook section 712. The base 6 forms a tapered surface 64 adjacent to the recess 63 for guiding the retention device 71 of the cover 7 to be received within the recess 63 when the cover 7 is assembled on the base 6.

A disadvantage exists in use of the conventional socket. An upper end of the vertical aligning section 711 of the retention latch may break after repeated engagement or when a large external force is exerted thereon. Hence, a CPU socket with an improved retention member is required to overcome the disadvantages of the prior art.

SUMMARY OF THE INVENTION

Accordingly, the object of the present invention is to provide a CPU socket having a separate retention member for enhancing the reliability of the CPU socket.

In order to achieve the object set forth, a CPU socket for connecting a CPU to a Printed Circuit Board (PCB) in accordance with the present invention comprises a base defining a plurality of passageways therethrough and a pair of recesses in a bottom surface thereof, a plurality of contacts received in the corresponding passageways, a cover defining a plurality of holes in alignment with the passageways of the base and a pair of slits in an upper surface thereof corresponding to the pair of recesses of the base, and a pair of retention members each having a securing portion retained in the cover and an elastic engaging portion received in the recess of the base. When the cover moves between an open position where the pins of the CPU are disconnected from the conductive contacts of the base and a closed position where the pins of the CPU are connected with the conductive contacts of the base, the elastic engaging portion moves in the recess while preventing the cover form separating the base.

Other objects, advantages and novel features of the invention will become more apparent from the following detailed description when taken in conjunction with the accompanying drawings.

DETAILED DESCRIPTION OF THE INVENTION

Figure 1:
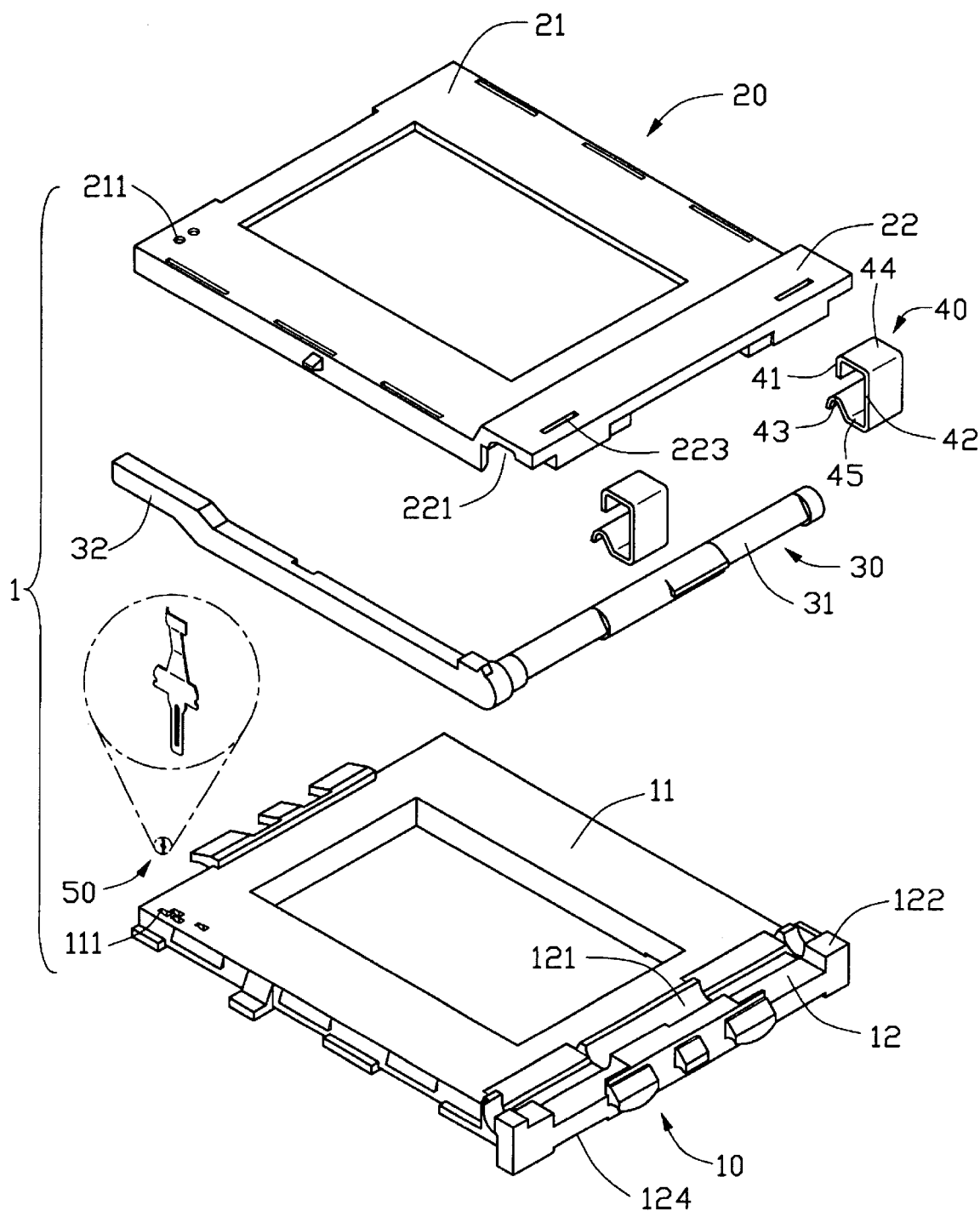
FIG. 1 is an exploded perspective view of a CPU socket in accordance with a first embodiment of the present invention.
Figure 2:
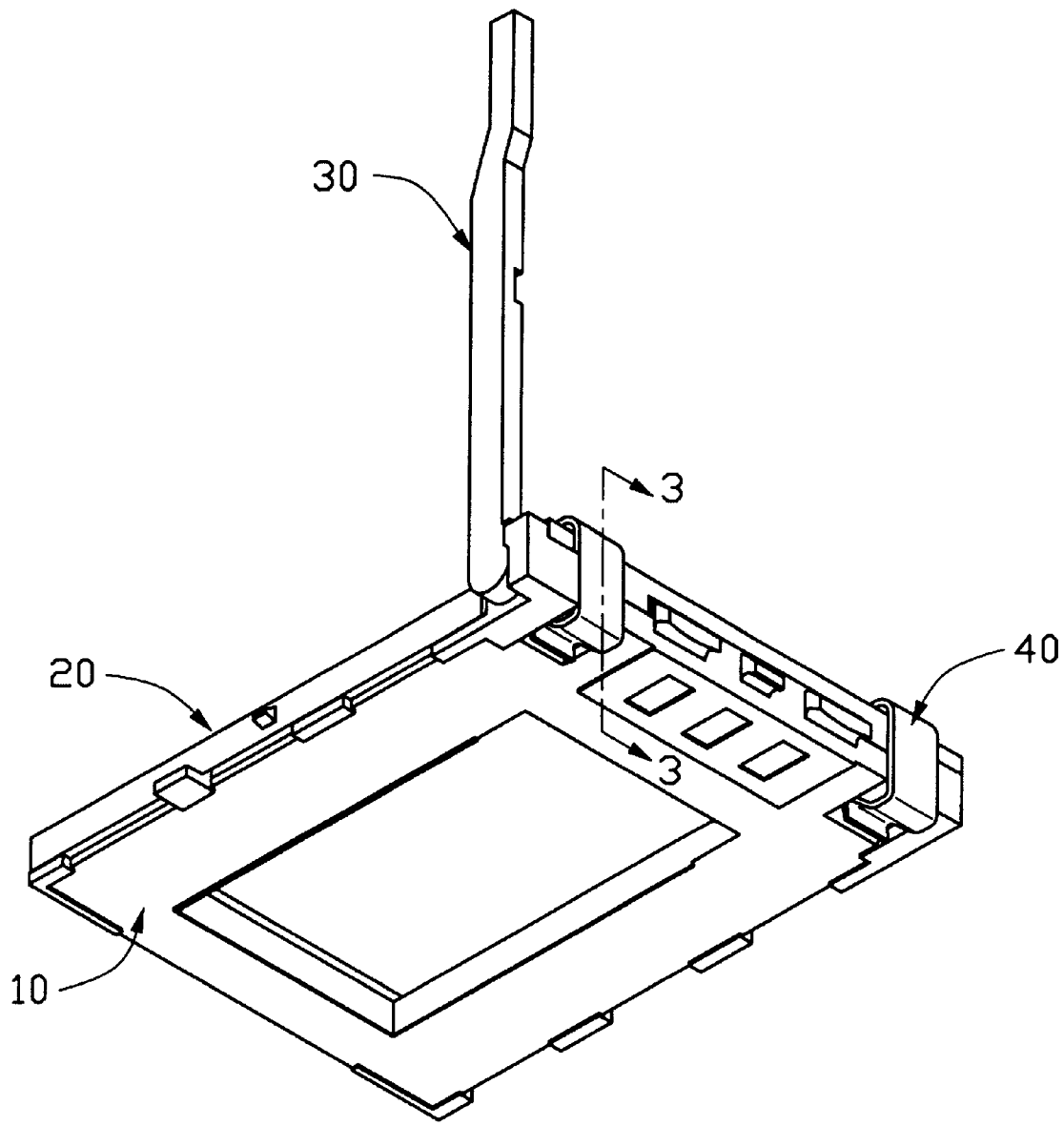
FIG. 2 is a bottom perspective view of the assembled CPU socket of FIG. 1, with a lever thereof in a vertical position.
Figure 3:
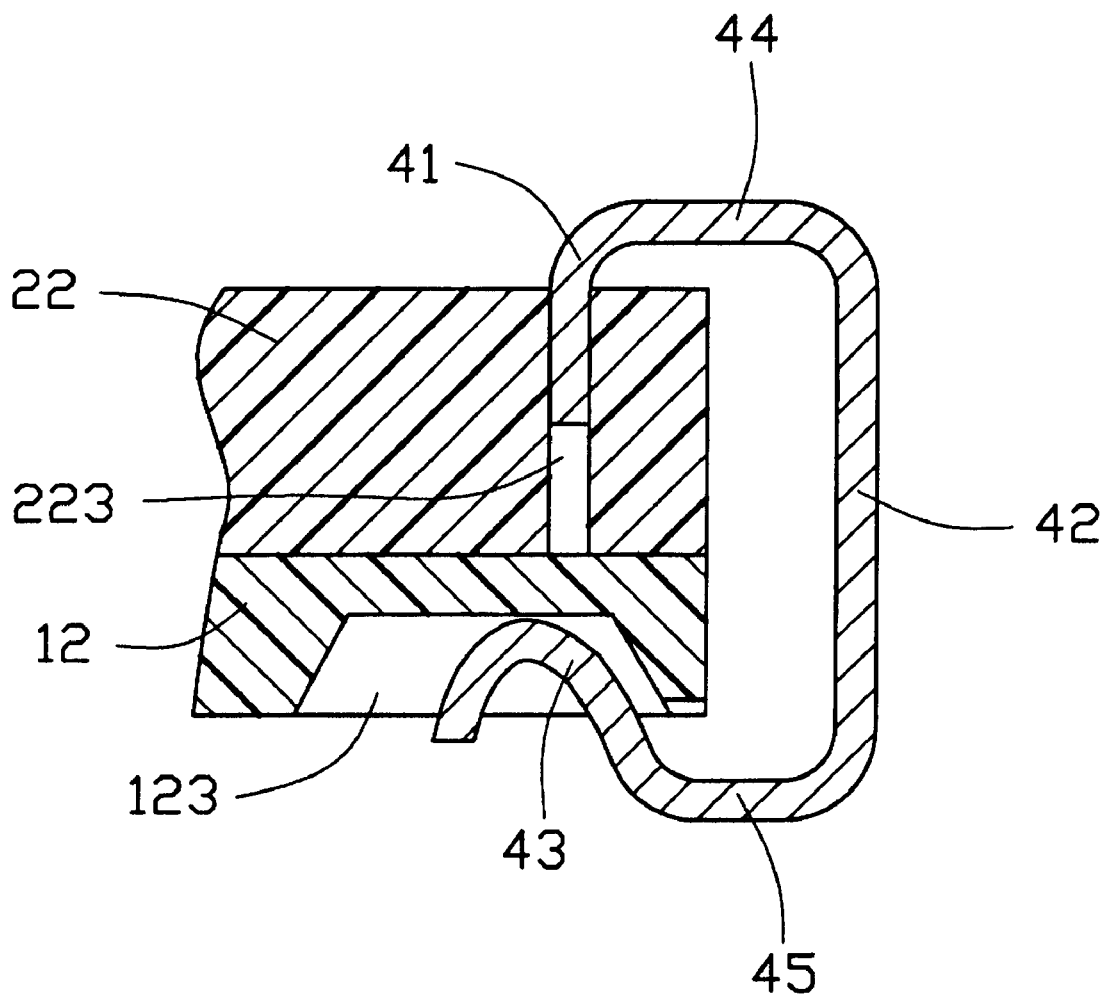
FIG. 3 is a partial, cross-sectional view taken along line 3—3 of FIG. 2.

Referring to FIGS. 1, 2 and 3, a CPU socket in accordance with the present invention includes a base 10, a plurality of contacts 50 received in the base 10, a cover 20 movably mounted on the base, a lever 30 for driving the cover 20 to move along the base 10, and a pair of retention members 40.

The base 10 includes an insulative housing 11 and a platform 12 protruding from a side of the housing 11. The housing 11 defines a plurality of vertical passageways 111 (only four shown) therethrough for receiving a corresponding number of contacts 50 therein. The platform 12 defines a half channel 121 in a top surface thereof spanning from one end to another end thereof. A pair of blocks 122 is respectively formed on opposite ends of the platform 12. The platform 12 defines a pair of recesses 123 (shown in FIG. 3) in a bottom surface thereof proximate to the pair of blocks 122. The platform 12 further defines a pair of cutouts 124 in an outer sidewall thereof in communication with the pair of recesses 123.

The cover 20 has a contour similar to the base 10 and includes an insulative housing 21 and a ledge 22 corresponding to the platform 12. The housing 21 defines a plurality of pin holes 211 (only two shown) in alignment with the passageways 111, respectively, so that the pins of the CPU (not shown) may project downwards through the corresponding holes 211 in the cover 20 and further into the corresponding contact holes 111 in the base 10 for mechanical and electrical engagement with the corresponding contacts 50 therein. The ledge 22 defines another half channel 221 corresponding to and having a shape similar to the channel 121. The ledge 22 also has a pair of slits 223 corresponding to the recesses 123 in the base 10.

The retention member 40 is punched by a metal sheet or molded by plastic and comprises a vertical plate 42, and upper and lower horizontal plates 44, 45 extending from opposite ends of the vertical plate 42 perpendicularly. A securing portion 41 downwardly extends from an end of the upper horizontal plate 44 and an elastic arcuate engaging portion 43 upwardly and outwardly extends from an end of the lower horizontal plate 45.

The lever 30 includes an actuation handle 32 and a cam shaft 31. The cam shaft 31 is received within a channel formed by the two half channels 221, 121 respectively defined in the cover 20 and the base 10.

In assembly, the cam shaft 31 is positioned in the half channel 121. The securing portion 41 of the retention member 40 is secured in the slit 223 of cover 20. Alternatively, the securing portion 41 may be insert molded with the cover 20. The cover 20 is movably mounted on the base 10 and the lever 30 drives the cover 20 to move between an open position where the pins of the CPU is disconnected from the contacts 50 of the base 10 and a closed position where the pins of the CPU is connected with the contacts 50 of the base 10. The pair of elastic engaging portions 43 of the retention member 40 are received in the pair of recesses 123. When the cover 20 moves from the open position to the closed position, the elastic engaging portion 43 moves in the recess 123.

Figure 4:
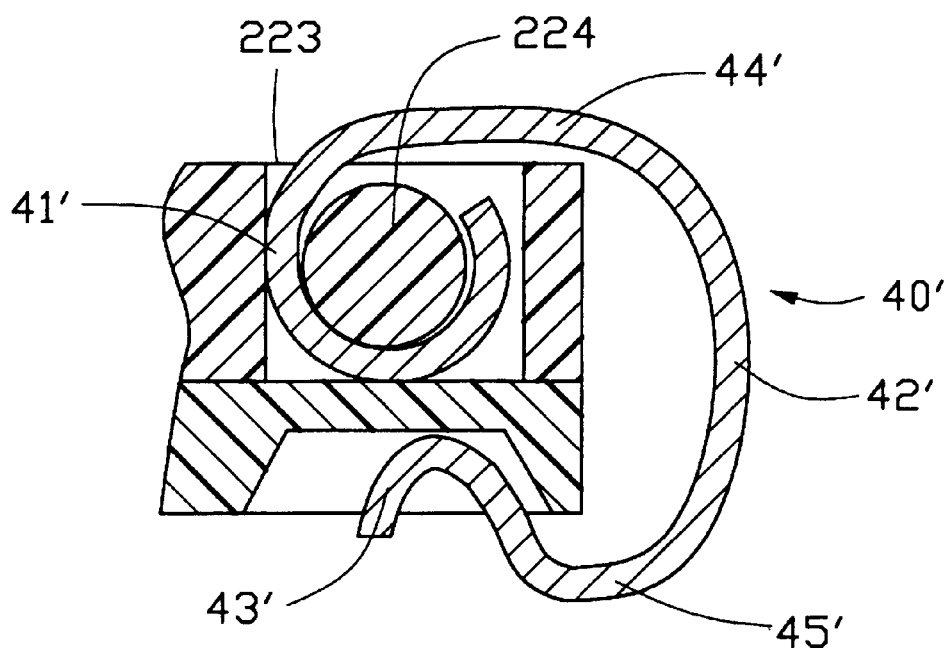
FIG. 4 is a partial, cross-sectional view of a second embodiment of the present invention.
Figure 5:
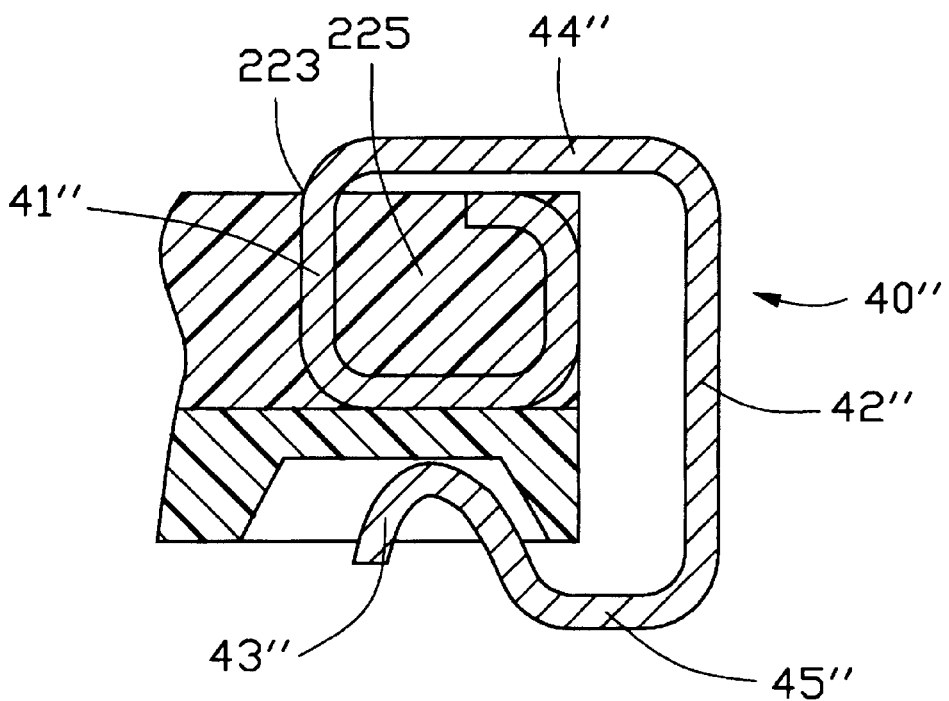
FIG. 5 is a partial, cross-sectional view of a third embodiment of the present invention.
Figure 6:
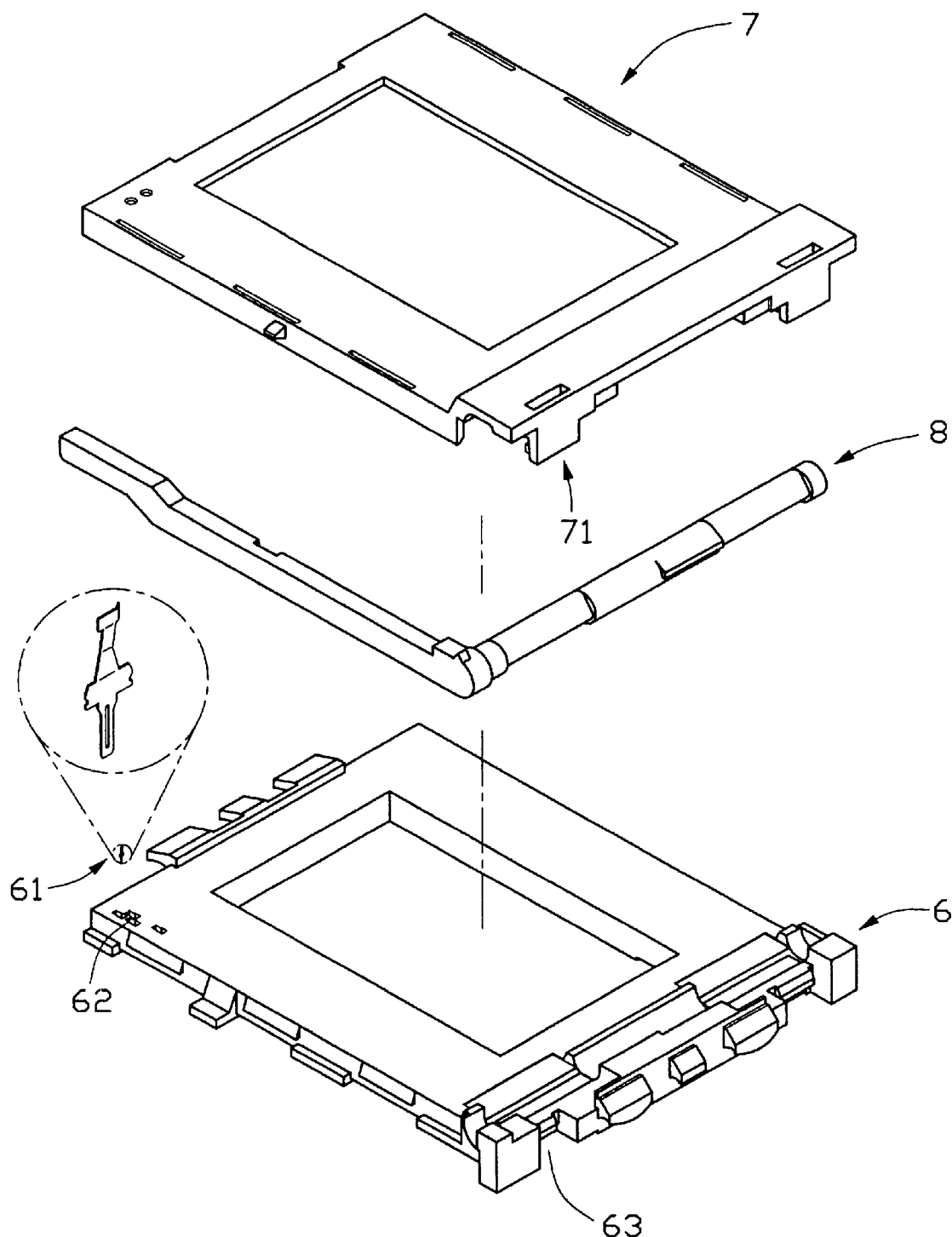
FIG. 6 is an exploded perspective view of a conventional CPU socket.
Figure 7:
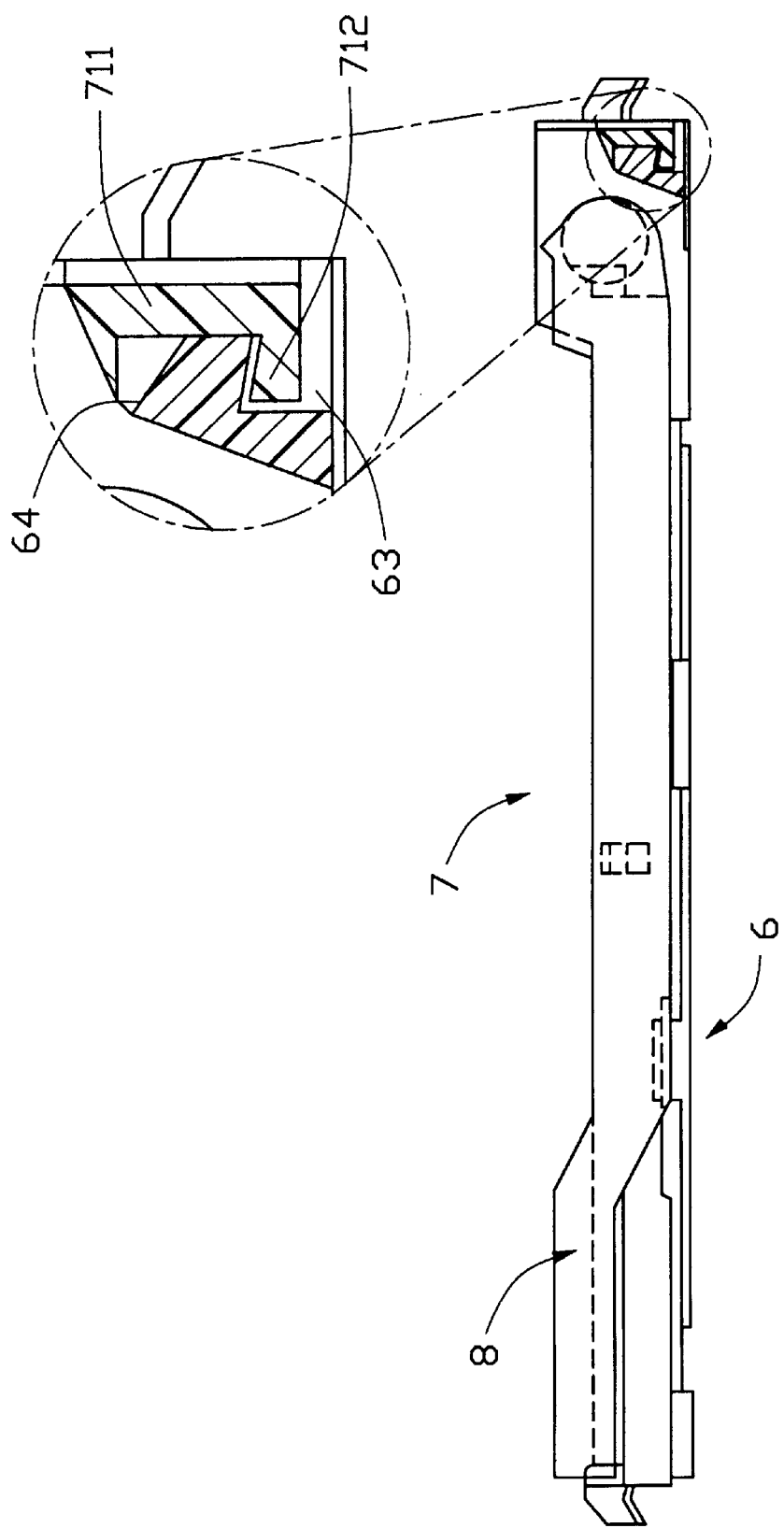
FIG. 7 is a side view of the assembled CPU socket of FIG. 6, partially cut out to illustrate the engagement between a retention latch and a base.

By the provision of the retention members 40, the reliability of engagement between the cover 20 and the base 10 is enhanced. Referring to FIG. 4, a second embodiment in accordance with the present invention is to add an axle 224 in the recess 223 and the securing portion 41' of the retention member 40' is wound around the axle 224. Referring to FIG. 5, a third embodiment in accordance with the present invention is to insert molding the securing portion 41" of the retention member 40" in the cover 20. It is noted that, although the securing portion of the retention member is shown to be secured in the cover in the three embodiments, the securing portion may also be secured in the base and the elastic engaging portion may be movably assembled to the cover, which performs the same function and which is within the skill of ordinary artisan.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket comprising:

a base defining a plurality of passageways therethrough;

a plurality of conductive contacts inserted into corresponding passageways;

a cover movably mounted on the base and defining a plurality of holes in alignment with the passageways of the base;

a retention member having one end secured in one of the base and the cover, and the other end movably assembled to the other one of the base and the cover; wherein the base defines a pair of recesses in a bottom surface thereof and the cover defines a pair of slits in an upper surface thereof; wherein one end of the retention member is retained in a corresponding slit of the cover and the other end movably received in a corresponding recess of the base; wherein the retention member comprises a vertical plate, an upper and a lower horizontal plates respectively extending from opposite ends of the vertical plate, and the two ends of the retention member respectively extend from the upper and the lower horizontal plates; wherein the base has a pair of cutouts communicating with the recesses.

2. The electrical socket as described in claim 1, wherein the electrical socket further comprising an actuator mechanism fitted between the base and the cover for moving the cover along the base.

3. The electrical socket as described in claim 1, wherein the cover defines a recess and an axle in the recess, and said one end of the retention member is wound around the axle.

4. The CPU socket as described in claim 1, wherein said one end of the retention member is insert molded in the cover.

5. An electrical connector comprising:

an insulative base with a plurality of contacts therein;

an insulative cover moveable mounted upon the base with a plurality of holes in alignment with the corresponding terminals, respectively;

an actuation device assembled to both said base and said cover to move the cover relative to the base; and a discrete metal retention member disposed around said actuation device; wherein said retention member is structurally configured to not only efficiently clamp the base and the cover together without vertical relative movement between the cover and the base, but also properly allow horizontal relative movement between the cover and the base; wherein the base defines a pair of recesses in a bottom surface thereof and the cover defines a pair of slits in an upper surface thereof; wherein one end of the retention member is retained in a corresponding slit of the cover and the other end movably received in a corresponding recess of the base; wherein said retention member includes at least a vertical plate, and upper and lower horizontal plates respectively extending from opposite ends of the vertical plate; wherein there is a horizontal clearance between the base and the retention member to allow the retention member with the associated cover to horizontally move relative to the base.

6. The connector as described in claim 5, wherein said retention member includes a horizontal section close to a bottom face of the base.

* * * * *